United States Patent [19]

Sweha et al.

[11] Patent Number: 5,046,046
[45] Date of Patent: Sep. 3, 1991

[54] REDUNDANCY CAM USING WORD LINE FROM MEMORY

[75] Inventors: Sherif Sweha, Citrus Heights; Mark Bauer; Phil Kliza, both of Folsom, all of Calif.

[73] Assignee: Intel Corporation, Santa Clara, Calif.

[21] Appl. No.: 321,904

[22] Filed: Mar. 10, 1978

[51] Int. Cl.$^5$ .................... G11C 15/04; G11C 11/34; G11C 7/00
[52] U.S. Cl. ...................... 365/200; 365/49; 365/185
[58] Field of Search ............... 365/200, 210, 185, 49; 371/81, 10.3

[56] References Cited

U.S. PATENT DOCUMENTS 4,250,570 2/1981 Tsang et al. .................. 365/200

FOREIGN PATENT DOCUMENTS 0058049 8/1982 European Pat. Off. .

Primary Examiner—Joseph A. Popek
Assistant Examiner—Jack A. Lane
Attorney, Agent, or Firm—Blakely, Sokoloff, Taylor & Zafman

[57] ABSTRACT

A redundancy programming circuit employing a two EPROM cell CAM for storing programmed states of redundant elements. The CAMs are disposed aside a memory array and word lines of the array are extended to the CAMs for programming the CAMs. Two word lines are coupled to each EPROM cell so that programming can still be achieved in the event one of the lines is defective.

7 Claims, 3 Drawing Sheets

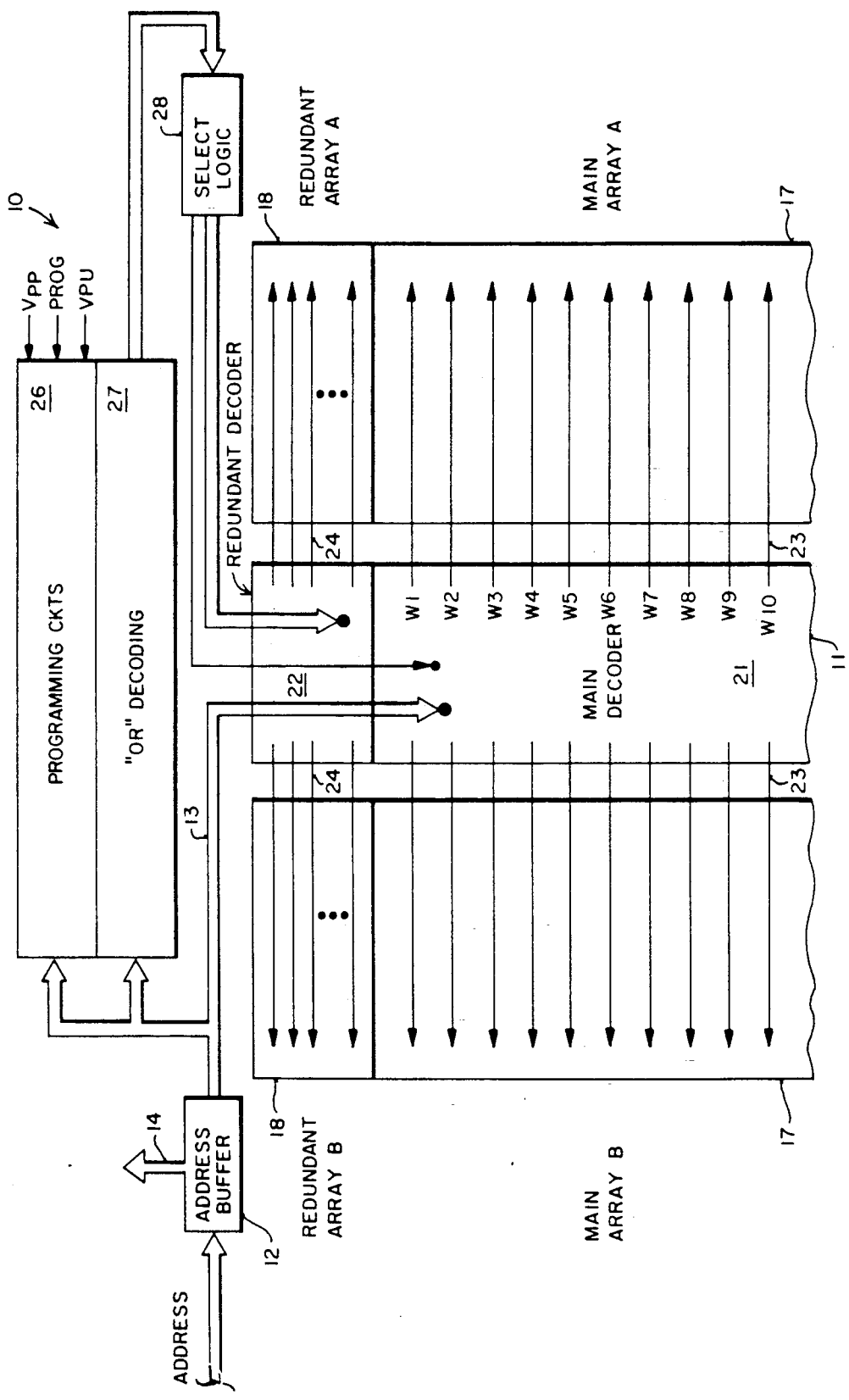
FIG_1 (PRIOR ART)

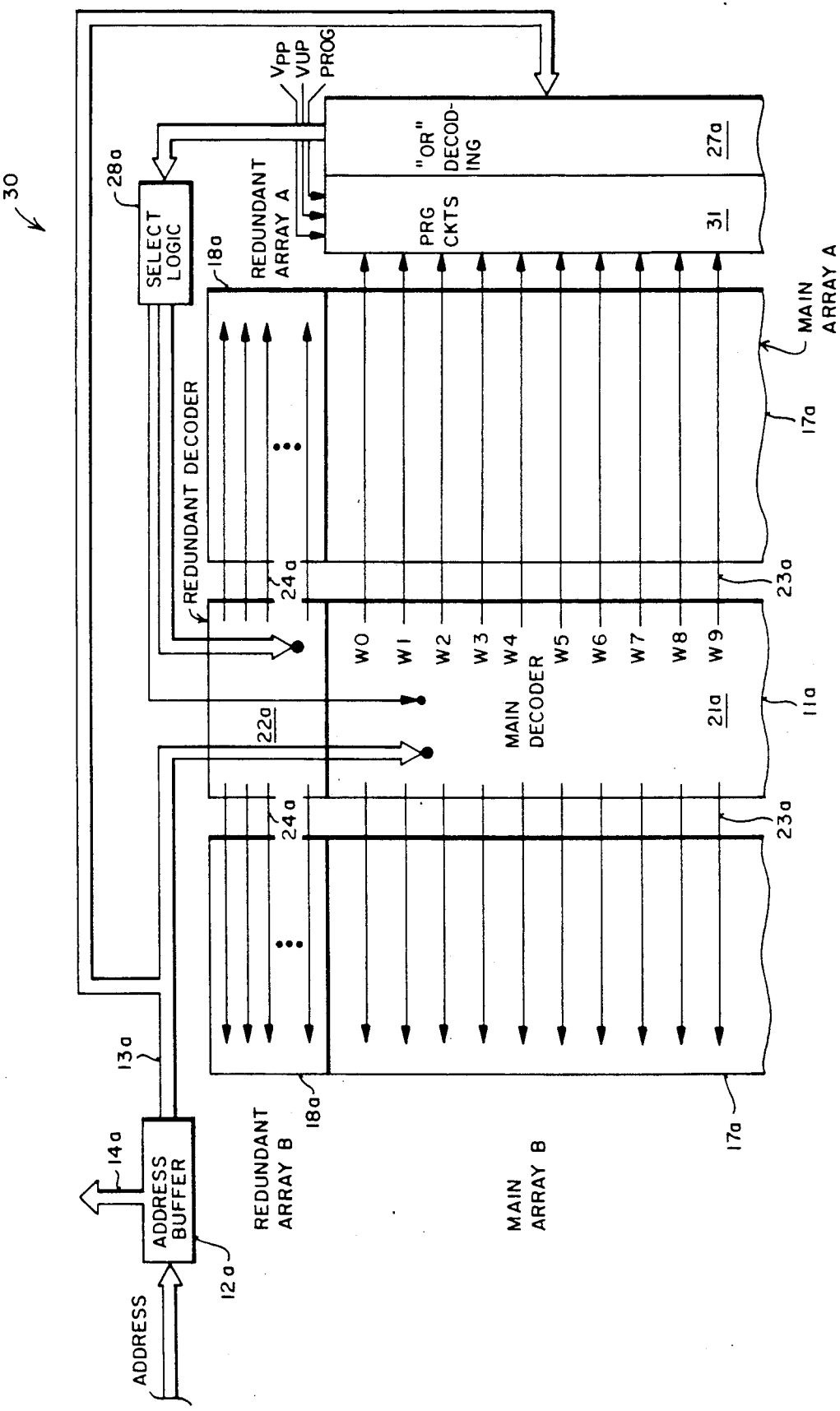
FIG._2

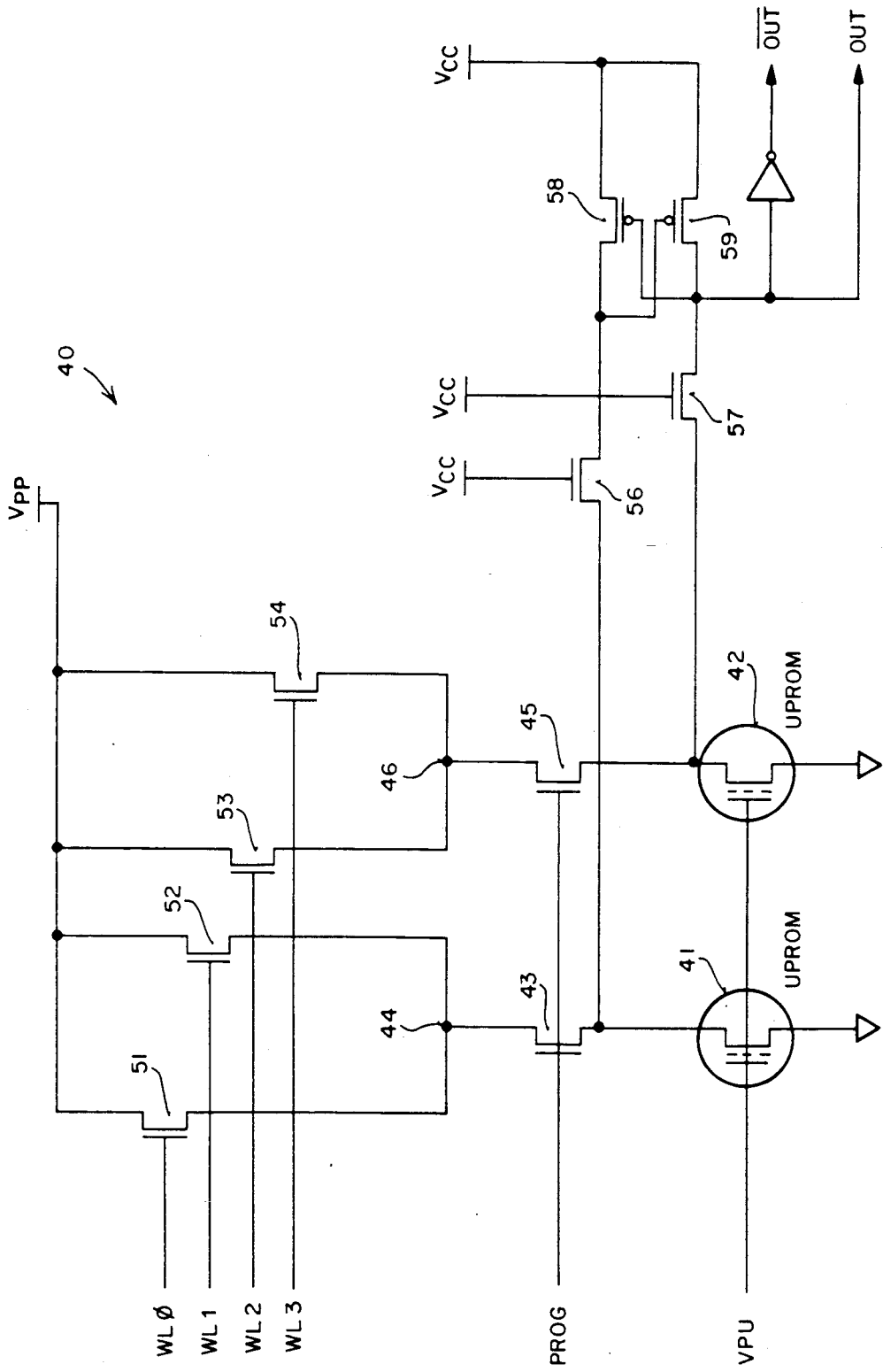
FIG_3

REDUNDANCY CAM USING WORD LINE FROM MEMORY

BACKGROUND OF THE INVENTION

1. Field of the Invention

This invention relates to the field of memory arrays and in particular to a circuitry for programming redundant memory.

2. Prior Art

A memory array, such as a random access memory (RAM) or an erasable programmable read-only-memory (EPROM), is generally comprised of binary elements arranged in a matrix of rows and columns. Addresses associated with the array access memory locations within the array. Typically, decoders are coupled to the memory to provide the decoding of the address signal for accessing the various binary elements, which are also referred to as memory cells. The inputs to the array are provided on the word lines, which are usually the row lines, and outputs from the array are provided on the bit lines, which are usually the column lines. The design and manufacture of various semiconductor memories and memory arrays are well-known in the prior art.

In the manufacture of such memory arrays, processing defects often randomly occur across the memory chip. In most instances, these memory chips are fully functional except for a single or a small number of rows or columns containing the defective cells(s). In order not to scrap a chip for having a single or a small number of defects, defect tolerant memory devices have been devised in which a redundant row and/or column of cells is substituted for a selected row and/or column containing the defective cell(s).

Various prior art schemes for providing fault tolerant memory are described in U.S. Pat. Nos. 3,659,275; 3,735,368; 3,753,244; 3,753,235; and 4,051,354. In U.S. Pat. No. 4,250,570, the redundant memory circuit programs the redundant decoders coupled to the redundant rows or columns, having initially unspecified addresses, to match the addresses of defective rows or columns having addresses associated therewith and disables one or more of the defective rows or columns having addresses associated therewith. The programming of the decoder is achieved by the use of fusible links, wherein the address decoding is achieved by open circuiting selected fusible links.

An improved addressing scheme for single chip memories, which includes a plurality of redundant lines and associated cells, is taught in U.S. Pat. Nos. 4,358,833 and 4,441,170. Aside from fusible links, other schemes are known for providing the programming circuitry to program the redundancy circuit. That is, once the defective cells are located, the redundancy circuit must be programmed, so that address signals which would access the defective cells are rerouted to the redundant memory.

Further, another scheme for providing redundant programming is achieved by the use of a content addressable memory (CAM). A CAM provides for storing the addresses of defective locations of the main memory array. One such defect tolerant memory system using a CAM is taught in U.S. Pat. No. 3,633,175. However, more recently semiconductor memory devices utilize redundancy schemes where the redundancy storage elements in the CAMs are similar to the cells used in the main memory. Instead of fusible links, actual memory cells are used to provide the programming. One such example is described in a copending application Ser. No. 309,320, filed Feb. 10, 1989, entitled "Redundancy Decoding Circuit Using N-Channel Transistors".

However, it is to be noted that in the programming of redundant memory, those redundant addresses are provided by a special redundancy programming circuitry which blows the fuses in the fusible link scheme or stores a given state in a CAM cell scheme. These redundant programming circuitry are generally coupled to receive address signals which are then used to provide the programming voltage. Where CAM cells are used, such as EPROM CAM cells, the redundant programming circuit must basically include a duplication of the main memory programming circuit in order to program the redundant EPROM cells.

It is appreciated that by combining a portion of the main memory programming circuitry with the redundancy programming circuitry, some of the duplication can be alleviated.

SUMMARY OF THE INVENTION

The present invention describes a scheme in which redundancy programming is provided by CAM cells which are coupled to word lines of a memory array. EPROM CAM programming circuitry is placed aside the memory array and word lines of the memory array are extended into the programming circuitry. The decoded addresses on the word lines are used to program the CAM cells for storing addresses of redundant elements.

In the preferred embodiment, two word lines are coupled to each EPROM in the CAM cell, so that in the event one of the word lines is defective, the second word line can be used to program the cell. Two cells are used for each CAM for storing a programmed state and its complement. The two cell CAM then operates to provide a full latch output for redundancy, such two cell/full latch CAMs have the advantage that no reset circuitry is required during chip power up.

BRIEF DESCRIPTION OF THE DRAWINGS

FIG. 1 is a circuit shematic diagram of a prior art memory device utilizing input address lines to program redundancy circuits.

FIG. 2 is a circuit schematic diagram of the device of the present invention, wherein decoded word lines are used to program the redundancy circuits.

FIG. 3 is a circuit schematic diagram of a redundancy CAM cell of the preferred embodiment.

DETAILED DESCRIPTION OF THE PRESENT INVENTION

A redundancy scheme and circuit which employs a portion of the main memory programming circuit is described. In the following description, numerous specific details, such as a specific addressing scheme, memory device, etc., are set forth in order to provide a thorough understanding of the present invention. However, it will be obvious to one skilled in the art that the present invention may be practiced without these specific details. In other instances, well-known circuits have not been described in detail in order not to unnecessarily obscure the present invention. Further, for the purpose of clarity, only the row redundancy circuit is discussed. It is to be appreciated that the present invention can be readily adapted to be used with the column redundancy.

Referring to FIG. 1, a prior art scheme for programming an integrated circuit memory device is shown. Memory device 10 is shown comprised of two memory arrays A and B. A common decoder 11 is used to provide decoding to both arrays A and B. Address signals to the device are coupled to an address buffer 12 for buffering the address signal. Some or all of the buffered address signals are then provided to the decoder 11 on bus 13. It is to be appreciated that for most integrated circuit (IC) memory devices, decoder 11 is used for providing X (row) addresses for accessing arrays A and B, and is commonly referred to as an X-decoder. An additional output from buffer 12, either on bus 13 or on another bus 14, are coupled to provide other addressing, such as signals to a Y (column) decoder.

Each array A and B is comprised of a main memory 17 and a redundant memory 18. Further decoder 11 is also comprised of a main decoder 21 and a redundant decoder 22. A plurality of word lines emanate from the main decoder 21 to be utilized as input signal lines to the main memory 17 of both arrays A and B. Also, a plurality of word lines emanate from the redundant decoder 22 to be utilized as input signal lines to the redundant memory 18 of both arrays A and B. Address signals on bus 13 are coupled to the main decoder 21. Decoder 21 provides the decoding for selecting the activation of the appropriate word line or lines 23. The use of decoders, such as decoder 21, for activating word lines to access selected cells of a memory array are well-known in the prior art. Further, the actual number of arrays present in a device is a design choice. Two arrays are shown in the example of FIG. 1, because the use of dual arrays in combination with a single common decoder 11 is a well-known practice in the prior art.

Signals on bus 13 are also coupled to a redundancy programming circuit 26 and to an OR decoding circuit 27. The output from the OR decoding circuit is coupled to the redundancy decoder 22 through select logic 28. It is to be appreciated that the select logic 28 can be included within the OR decoder 27. Further, although an OR function is shown as the logic of decoder 27, a variety of logic functions can be readily used to provide the decoding. For example, the redundant memory circuit described in U.S. Pat. No. 4,250,570 can be readily adapted for circuits 26, 27, and 28.

The redundancy decoder 22 decodes the inputted signals and activates appropriate word lines 24 to access memory cells of redundant memory arrays A and B. As shown in the example, where the decoder 11 is used as a row decoder, each of the word lines 23 and 24 accesses a given row of main memory 17 or redundant memory 18, respectively. The select logic circuit 28 is used to enable and disable memories 17 and 18 for the purpose of selecting the appropriate memory 17 or 18.

When device 10 is manufactured, it is tested for defective memory cells and locations of these defective memory cells are noted. Where a defective memory cell is present, it is a typical practice to replace the complete row which contains the defective cell. Once the defective row address(es) is/are noted, the redundancy programming circuit 26 is programmed with these addresses. The addresses are provided to programming circuit 26 on bus 13 and stored in the programming circuit 26. In most instances, the programming is permanent so that users of device 10 cannot readily change the redundancy programming.

In operation, address signals are provided to device 10 for accessing the memory 17. Signals on bus 13 are coupled to the main decoder 21 for activation of the appropriate word line 23. At the same time, those address signals on bus 13 are also coupled to the OR decoder 27. Decoder 27 compares the address to the stored (programmed) addresses. If a match occurs, signifying that a defective row is being accessed, an output is provided from decoder 27 to decoder 22 to access the corresponding redundant row of redundant memory 18. In this instance, select logic 28 enables the redundancy decoder 22 and disables main decoder 21. In essence, a redundant row replaces the defective row in main memory.

It is to be appreciated that the operation of the device of FIG. 1 is well-known in the prior art. However, disadvantages reside in the structure and operation of various prior art devices, such as device 10. For example, if CAM cells are used for storing the programmed addresses in circuit 26, then specialized redundancy programming circuitry must be included in programming circuit 26, in order to program the CAM cells. If device 10 is an EPROM, the EPROM cells will be used as the memory cells in the CAM. These CAM EPROMs in circuit 26 will require separate programming structures, such as a separate set of word lines for the CAM EPROMs, as well as the high voltage switches. These high voltage switches usually require a large layout on the chip, such that additional space is required on the chip for this layout.

Referring to FIG. 2, a device 30 incorporating the scheme and circuit of the present invention is shown. Those elements of FIG. 2, which are equivalent to those corresponding elements of FIG. 1, have retained the same reference designations, but have a letter "a" appended. Address signals to device 30 are coupled to an address buffer 12a, which outputs are provided on bus 13a and sometimes on a second bus 14a. Address signals on bus 13a are coupled to a main decoder 21a of decoder 11a for decoding to select the appropriate word line(s) 23a for accessing main memory 17a. Decoder 11a also includes a redundancy decoder 22a, which decodes redundancy addresses for selecting the redundant word line(s) to access a row of redundant memory 18a. Addresses on bus 13a are also coupled to an OR decoding circuit 27a, which output is coupled to a select logic 28a. The select logic 28a is coupled to decoder 11a for enabling the access of main memory 17a or redundant memory 18a. These described aspects of device 30 of the present invention is similar to that portion described in reference to device 10 of FIG. 1.

A programming circuit 31 of the present invention is coupled to operate with the OR decoder 27a. Although the programming circuit 31 provides the similar function as the programming circuit 26 of FIG. 1, disadvantages inherent in the prior art are overcome by the use of programming circuit 31 of the present invention. Programming circuit 31 (as typically circuit 26) utilizes CAMs, wherein the CAM cells are formed from the same memory elements as memories 17a and 18a. In an EPROM device, memories 17a and 18a and the CAM cells are all derived from the same EPROM technology.

The programming circuit 31 is coupled to operate in combination with word lines 23a of memory 17a. Where multiple arrays operate from the decoder 21a, only word lines 23a from one array, such as array A in FIG. 2, need be coupled to programming circuit 31. The word lines 23a of memory 17a are extended past the memory 17a and are coupled to the programming circuit 31. The EPROMs of the programming circuit 31 are coupled to utilize these word lines 23a. An EPROM cell can be coupled to each of the word lines extending into the programming circuit 31, wherein these EPROM cells can be programmed by the same technique of activating a given word line to program a cell or a row of cells in memory 17a.

By having EPROM CAM cells of the programming circuit 31 associated with each address element of each redundant element, the corresponding CAM cell associated with a given redundant element can be programmed from word lines 23a. The extension of word lines 23a to function as high voltage decode lines for the EPROM CAMs of the programming circuit alleviates the need for a separate set of high voltage switches and decoders to program the CAM cells, as is the case of memory cells of the prior art programming circuit 26 of FIG. 1. The programming circuit 31, which is coupled to the OR decoding circuit 27a, operates in conjunction with the OR decoder 27a to output signals to the redundancy decoder 22a through select logic 28a. Again, the select logic 28a can be made a part of OR decoder 27a. Also, the decoding logic of OR decoder 27a is a design choice. One example of a decoding scheme is described in U.S. patent application Ser. No. 309,320, filed Feb. 10, 1989, entitled "Redundancy Decoding Circuit Using N-Channel Transistors" and is hereby incorporated by reference.

Additionally, it is to be noted that the layout of the programming circuit 31 of the preferred embodiment has an added advantage over the prior art device of FIG. 1. The physical layout of device 10 of FIG. 1 and that of device 30 of FIG. 2 are closely approximated by the positioning of the dual memory arrays A and B, common decoder 11 (11a), and circuits 26 and 27 (31 and 27a) as shown in the figures. That is, in both the prior art device 10 and in the device 30 of the present invention, the X-decoder is bounded on each side (horizontally) by a memory array. This is the actual layout on the chip wafer. Then for the prior art device 10, circuits 26 and 27 are typically placed either above or below (vertically) the X-decoder 11. This is generally done because of the difficulty and penalty of busing all required signals and power buses to the sides of the array.

However, in device 30 the programming and OR decoding circuits 31 and 27a are placed to the side (horizontally) of a memory array. This is the actual layout on the chip wafer for device 30. This horizontally adjacent architecture is possible due to the use of word lines 23a of memory 17a to operate as high voltage select lines to the EPROM CAMs of the programming circuit 31. Typically in most EPROM memory chips, extraneous space is available at the sides of an array. Circuits 31 and 27a would simply occupy this previously unused space. But by moving the programming and the OR decoding circuits from the area above the X-decoder, which area is generally tightly constrained, additional unused space is made available. A significant advantage results by having additional unused space above the X-decoder and the memory arrays, namely, the memory arrays can be expanded to occupy this freed space. That is, additional rows can be added to the memory arrays, thereby expanding the size of the memory.

Referring to FIG. 3 an EPROM redundancy CAM cell circuit 40 used in programming circuit 31 of the preferred embodiment is shown. Circuit 40 is comprised of two UPROM cells 41 and 42. Cells 41 and 42 of Circuit 40 are unerasable programmable read-only memories (UPROMs) so that once programmed with the redundancy information, cells 41 and 42 can not be readily erased. It is to be appreciated that EPROM cells or other types of memory cells can be readily used for cells 41 and 42. Although a single UPROM cell can be used, circuit 40 uses two UPROM cells 41 and 42 to provide a full latch configuration. UPROM cells 41 and 42 store a given state and its complement to provide a full latched output.

The floating gate UPROMs 41 and 42 have their sources coupled to Vss, which in this instance is ground. The gates of cells 41 and 42 are coupled to a programming voltage VPU. The drain of UPROM 41 is coupled through transistor 43 to node 44, while the drain of UPROM 42 is coupled through transistor 45 to node 46. Node 44 is coupled to a high potential, such as Vcc (or VPP), through two parallel transistors 51 and 52, while node 46 is coupled to the same high voltage through two parallel transistors 53 and 54. Transistors 51-54 are the high voltage switching transistors. The gate of each of the transistors 51-54 is coupled to a different word line 23 of memory 17a. The word lines WL# correspond to various rows of word lines, such as WL0-WL3. It is not essential that the word lines be sequential in order. Programming of cells 41 and 42 is achieved by selecting the appropriate word lines for switching on the appropriate switching transistors 51-54.

A programming signal PROG is coupled to the gates of transistors 43 and 45 to turn on these transistors during the programming mode. To program cell 41, either transistor 51 or 52 is turned on by placing a high signal state on its respective word line. To program cell 42, either transistor 53 or 54 is turned on by placing a high signal state on its respective word line. In either case, the signal VPU is also driven by a high voltage state. It is to be appreciated that only one of the pair of cells 41 and 42 is programmed, while the other is left in the erased state. Once programming has been achieved, transistors 43 and 45 are turned off so that transistors 51-54 are essentially removed from the circuit.

Further, it is to be noted that only one transistor of the pair of transistors 51 or 52 and 53 or 54 actually need to be present to couple the high voltage to the nodes 44 and 46. However, circuit 40 provides a safety net in the event a defect resides in a word line coupled to the programming circuit 31. Therefore, in the example provided in FIG. 3, if WL0 is defective, cell 41 can still be programmed through WL1.

A latch circuit is provided for the purpose of latching the state of the UPROM cells 41 and 42 as an output signal and its complement. The two cell CAM provides a full latch CAM, such that no reset circuitry is required during chip power-up. The drains of cells 41 and 42 are coupled through transistors 56 and 57, respectively, to cross-coupled load transistors 58 and 59. The output signal and its complement are coupled to the OR decoder 27a for comparing the stored state of the UPROMs with the inputted address signal during subsequent memory accessing operations. It is to be appreciated that a plurality of CAM circuits 40 are used in the programming circuit 31 of the preferred embodiment.

Further, it is to be stressed that address lines are not directly coupled to the programming circuit 31, but are used to program the prior art programming circuit 26. Decoded word lines are used instead to program the CAM cells of the programming circuit 31. Also, other circuits can be readily adapted to perform the equivalent function as the CAM circuit of FIG. 3 without departing from the spirit and scope of the present invention.

Additionally, it is to be noted that the described scheme is also applicable to column redundancy. The programming of the appropriate CAM circuits is provided the word lines and programming circuit 31 is still located on the side of the array. The output of decoder 27a will now go to a column redundancy.

We claim:

1. A redundant memory circuit for a memory array comprising:

a memory having a preselected number of rows and columns having addresses associated therewith, and one or more redundant rows or columns having initially unspecified addresses associated therewith;

a redundancy decoder coupled to said memory for decoding addresses associated with said memory and activating said one or more redundant rows or columns if a selected location of said memory is defective;

programming means coupled to said redundancy decoder for causing said redundant rows or columns having initially unspecified addresses associated therewith to be associated with addresses of said memory which are defective, wherein programming of said association is achieved by providing programming signals on one or more word lines having addresses associated therewith.

2. The circuit of claim 1 further including means for disabling said locations of said memory which are defective.

3. The circuit of claim 2 wherein said programming means includes a content addressable memory for storing said locations of said memory which are defective.

4. In an integrated circuit memory device having a memory array, wherein word lines coupled to said array access said array and wherein a redundant memory circuit provides for redundant rows or columns in place of defective rows or columns of said memory array, a redundant programming circuit for providing locations of defective rows or columns of said memory array, comprising:

a content addressable memory (CAM) coupled to said redundant memory circuit and to said memory array for storing locations of said defective rows or columns;

said CAM comprised of memory cells which are coupled to at least one of said word lines of said memory array through a switching transistor, wherein programming for storing locations of said defective rows or columns is achieved by activating said at least one of said word lines in order to drive said switching transistor to couple a programming voltage to said memory cells of said CAM.

5. The memory device of claim 4 wherein said CAM includes a latch for coupling an output from each memory cell.

6. The memory device of claim 5 wherein said memory cells are erasable programmable read-only memory (EPROM) cells.

7. The memory device of claim 5 wherein said memory cells are unerasable programmable read-only memory (UPROM) cells.

* * * * *